United States Patent
Maeda et al.

(10) Patent No.: US 7,752,595 B2
(45) Date of Patent: Jul. 6, 2010

(54) METHOD FOR VERIFYING AND CORRECTING POST-OPC PATTERN LAYOUT

(75) Inventors: Shimon Maeda, Tokyo (JP); Koujirou Ohyoshi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 11/892,764

(22) Filed: Aug. 27, 2007

(65) Prior Publication Data

US 2009/0053619 A1    Feb. 26, 2009

(30) Foreign Application Priority Data

Aug. 28, 2006    (JP) ............... 2006-231142

(51) Int. Cl.
*G06F 17/50* (2006.01)
(52) U.S. Cl. ............... 716/21; 716/19; 716/20; 430/5
(58) Field of Classification Search ............. 716/19–21; 430/5
See application file for complete search history.

(56) References Cited

U.S. PATENT DOCUMENTS

| | | | |
|---|---|---|---|
| 6,653,026 B2 * | 11/2003 | Pierrat et al. ............. | 430/5 |
| 6,952,818 B2 * | 10/2005 | Ikeuchi .................... | 430/311 |
| 7,155,689 B2 * | 12/2006 | Pierrat et al. ............. | 716/4 |
| 7,418,694 B2 * | 8/2008 | Kobayashi et al. ........ | 716/21 |
| 7,530,049 B2 * | 5/2009 | Kobayashi et al. ........ | 716/19 |
| 2003/0115569 A1 * | 6/2003 | Ikeuchi .................... | 716/19 |
| 2004/0221255 A1 | 11/2004 | Pierrat et al. | |
| 2006/0228041 A1 * | 10/2006 | Joshi ....................... | 382/260 |
| 2006/0271906 A1 * | 11/2006 | Tang et al. ............... | 716/21 |
| 2008/0005704 A1 * | 1/2008 | Miloslavsky et al. ..... | 716/2 |

FOREIGN PATENT DOCUMENTS

JP    2005-156606    6/2005
JP    2006-053248    2/2006

OTHER PUBLICATIONS

Kim et al.; "Hotspot Detection on Post-OPC Layout Using Full Chip Simulation Based Verification Tool: A Case Study with Aerial Image Simulation"; Proceedings of SPIE vol. 5256 23rd Annual BACUS Symposium on Photomask Technology; SPIE Bellingham WA; 2003; vol. 5256; pp. 919-925.*

* cited by examiner

*Primary Examiner*—Naum B Levin
(74) *Attorney, Agent, or Firm*—Finnegan, Henderson, Farabow, Garrett & Dunner, L.L.P.

(57) ABSTRACT

A pattern producing method includes specifying a first pattern and a second pattern obtained by modifying the first pattern, specifying a correction area based on the second pattern, in a part of an area including the first pattern and the second pattern, producing at least a part of the first pattern, which is included in the correction area, as a correction target pattern, producing a part of the first or second pattern, which is not included in the correction area, as a correction reference pattern, correcting the correction target pattern on the basis of the correction target pattern and the correction reference pattern, and producing a pattern based on the corrected correction target pattern and the second pattern.

18 Claims, 8 Drawing Sheets

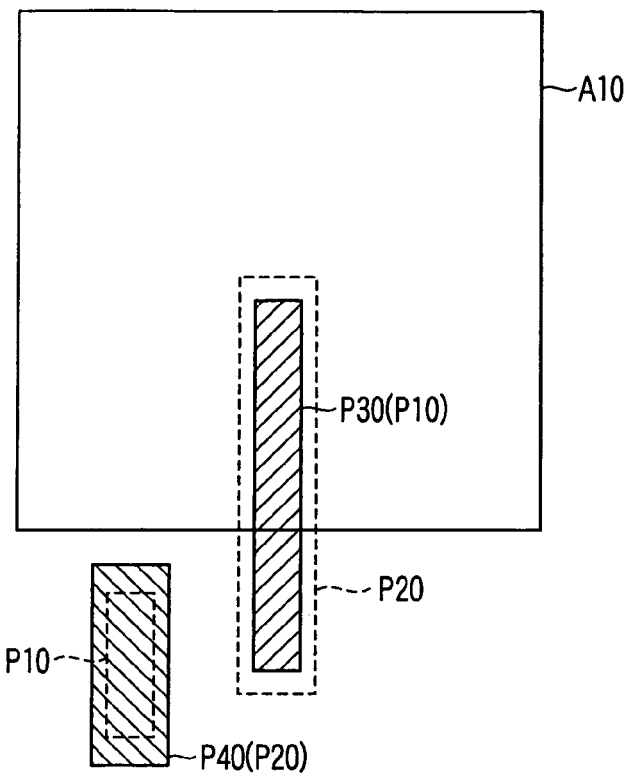
F I G. 14
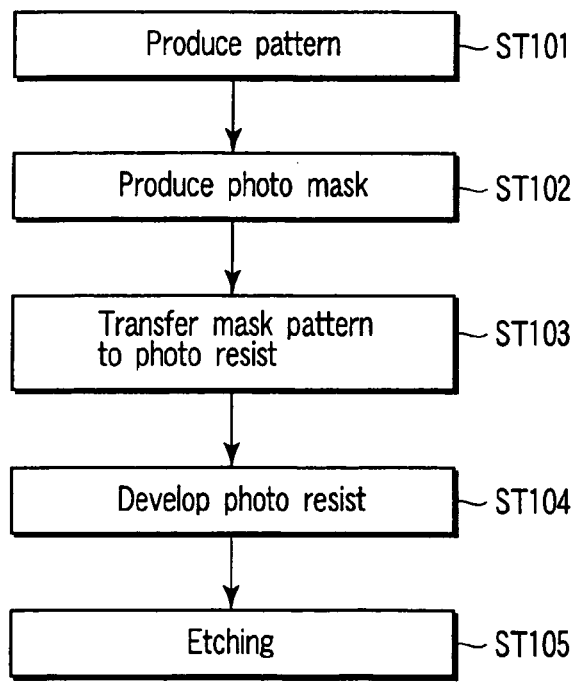
F I G. 15

METHOD FOR VERIFYING AND CORRECTING POST-OPC PATTERN LAYOUT

CROSS-REFERENCE TO RELATED APPLICATIONS

This application is based upon and claims the benefit of priority from prior Japanese Patent Application No. 2006-231142, filed Aug. 28, 2006, the entire contents of which are incorporated herein by reference.

BACKGROUND OF THE INVENTION

1. Field of the Invention

The present invention relates to a pattern producing method and the like.

2. Description of the Related Art

Increasingly miniaturized semiconductor devices have made it difficult to form a desired circuit pattern true to a design pattern on semiconductor wafers. Thus, the design pattern is normally subjected to optical proximity correction (OPC).

However, OPC may result in a defect (or hot) spot in which pattern size, inter-pattern distance, or the like fails to meet a predetermined condition. In this case, pattern correction and verification need to be repeated until the defect spot is eliminated (see, for example, Jpn. Pat. Appln. KOKAI Publication No. 2006-53248).

However, when the pattern correction and verification are performed on the entire design pattern, much time is required to obtain a final pattern free from defect spots.

BRIEF SUMMARY OF THE INVENTION

A first aspect of the present invention, there is provided a pattern producing method comprising: specifying a first pattern and a second pattern obtained by modifying the first pattern; specifying a correction area based on the second pattern, in a part of an area including the first pattern and the second pattern; producing at least a part of the first pattern, which is included in the correction area, as a correction target pattern; producing a part of the first or second pattern, which is not included in the correction area, as a correction reference pattern; correcting the correction target pattern on the basis of the correction target pattern and the correction reference pattern; and producing a pattern based on the corrected correction target pattern and the second pattern.

A second aspect of the present invention, there is provided a computer readable medium configured to store program instructions for execution on a computer, the program instructions causing the computer to perform: specifying a first pattern and a second pattern obtained by modifying the first pattern; specifying a correction area based on the second pattern, in a part of an area including the first pattern and the second pattern; producing at least a part of the first pattern, which is included in the correction area, as a correction target pattern; producing a part of the first or second pattern, which is not included in the correction area, as a correction reference pattern; correcting the correction target pattern on the basis of the correction target pattern and the correction reference pattern; and producing a pattern based on the corrected correction target pattern and the second pattern.

BRIEF DESCRIPTION OF THE SEVERAL VIEWS OF THE DRAWING

FIG. 14 is a diagram illustrating a variation of the pattern producing method in accordance with the embodiment of the present invention; and FIG. 15 is a flowchart showing a method for manufacturing a semiconductor device in accordance with the embodiment of the present invention.

DETAILED DESCRIPTION OF THE INVENTION

Embodiments of the present invention will be described with reference to the drawings.

Figure 1:
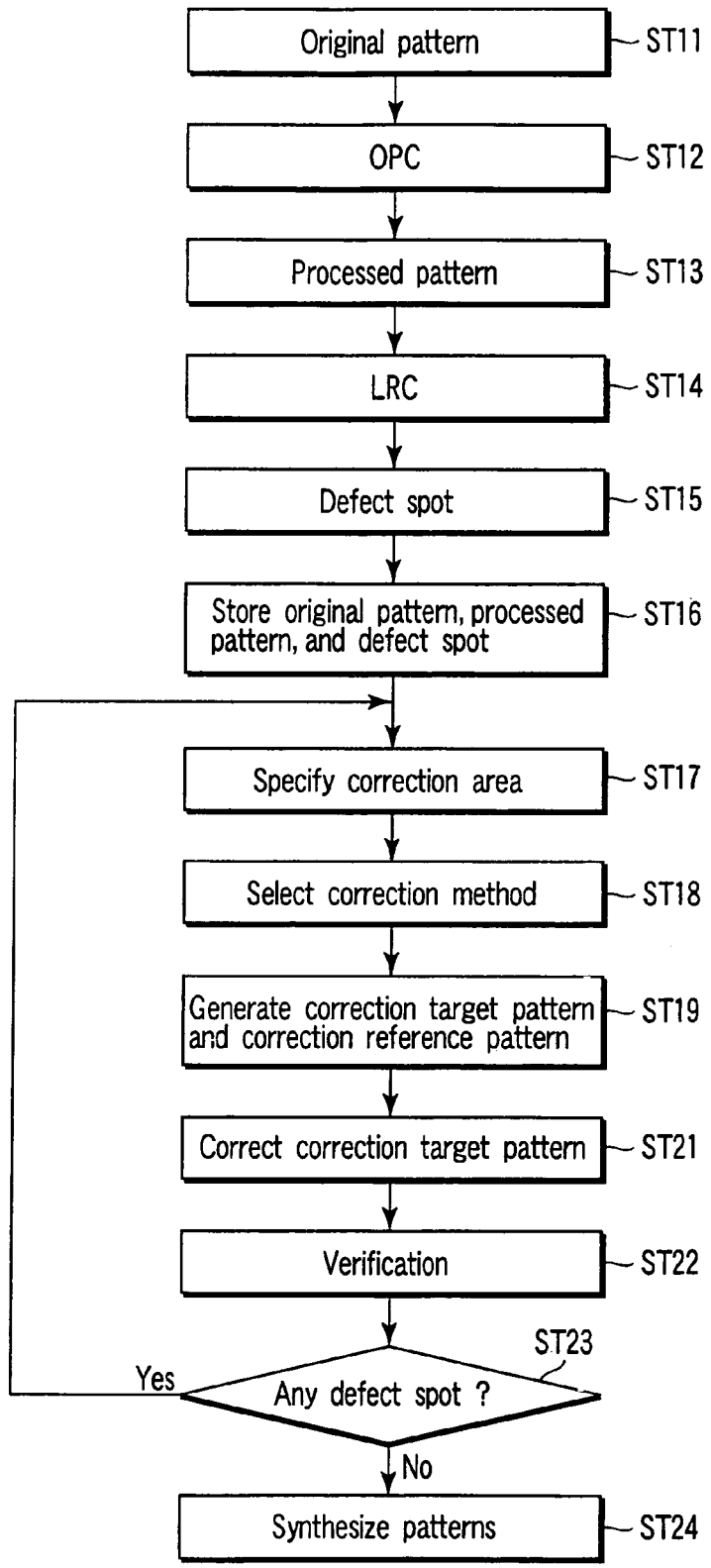
FIG. 1 is a flowchart schematically showing a pattern producing method in accordance with an embodiment of the present invention.

FIG. 1 is a flowchart schematically showing a method in accordance with the embodiment of the present invention. The present embodiment will be described below with reference to the flowchart.

An original pattern (first pattern) based on a design pattern (design data) is prepared (ST11). The original pattern corresponds to a lithography target to be formed in a lithography process. Optical proximity correction (OPC) is subsequently applied to the original pattern (ST12). This results in a processed pattern (second pattern) on which the OPC process has been executed (ST13).

Lithography rule check (LRC) is then applied to the processed pattern (ST14). The LRC process extracts a defect spot (ST15). The term "defect spot" as used herein means a spot at which the defect occurrence probability in a lithography process is greater than a predetermined value. Defects in the lithography process include a short defect (the defect in which patterns to be separated from each other contact each other) and an open defect (the defect in which patterns to be connected together are not connected together). The defect spot may be referred to as a hot spot.

Figure 2:
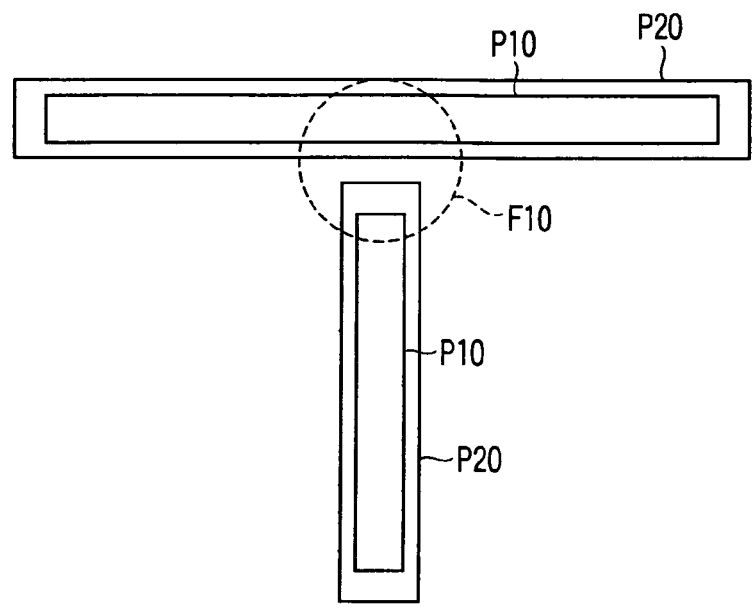
FIG. 2 is a diagram illustrating a part of the pattern producing method in accordance with the embodiment of the present invention.

FIG. 2 is a schematic view showing an original pattern P10, a processed pattern P20, and a defect spot F10 described above. The processed pattern P20 subjected to the OPC process is actually expressed as a complicated graphic but is simplified here for simplification of description. Data on the original pattern P10, the processed pattern P20, and the defect spot F10 is stored in a predetermined storage area (ST16).

Figure 3:
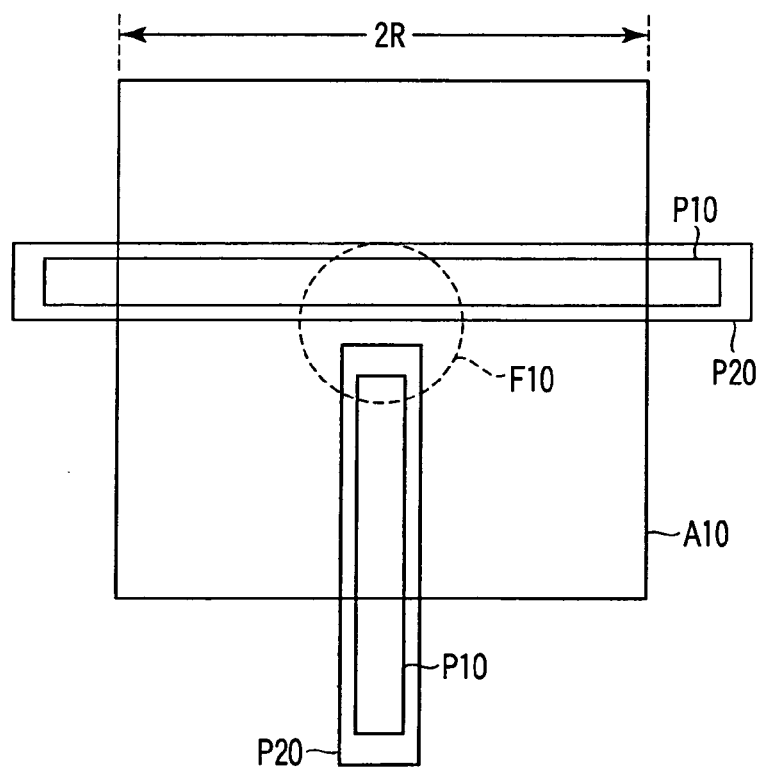
FIG. 3 is a diagram illustrating a part of the pattern producing method in accordance with the embodiment of the present invention.

Then, as shown in FIG. 3, a correction area A10 containing the defect spot F10 is specified (ST17). The correction area A10 is set to cover a given range around the defect spot F10. For example, the range covered by an optical effect during lithography is specified as the correction area A10. Specifically, when an optical radius is defined as R, the length of each side of the correction area A10 is about 2R.

A method for correcting the pattern is then selected (ST18). That is, a plurality of correction methods are prepared, and one of the methods according to the type of the defect spot F10 is selected. Specifically, a plurality of OPC programs are prepared, and an appropriate one of the OPC programs according to the type of the defect spot F10 is selected. For example, for the open defect, an OPC program is selected which provides a sufficient under dose margin for photolithography in order to correct the open defect. For the short defect, an OPC program is selected which provides a sufficient over dose margin for photolithography in order to correct the short defect.

A correction target pattern is then produced on the basis of the original pattern P10 and the correction area A10. A correction reference pattern is also produced on the basis of the processed pattern P20 and the correction area A10 (ST19). Here, the correction target pattern means a pattern to be corrected. The correction reference pattern means a pattern which is not to be corrected but which is taken into account in correcting the correction target pattern.

Figure 4:
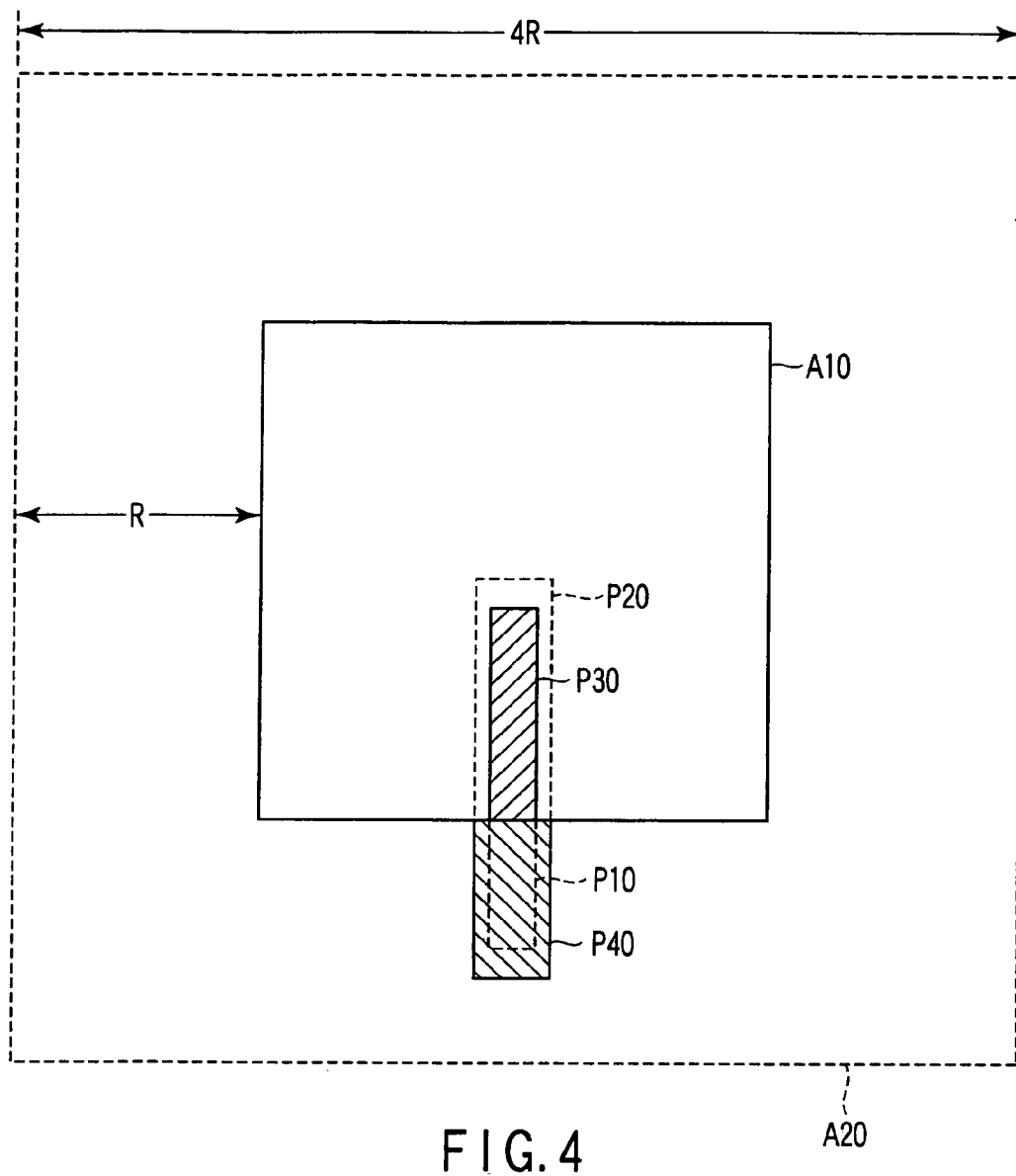
FIG. 4 is a diagram illustrating a part of the pattern producing method in accordance with the embodiment of the present invention.

FIG. 4 is a diagram showing a correction target pattern P30 and a correction reference pattern P40. In FIG. 4 and subsequent figures, the pattern corresponding to a horizontally extending pattern shown in FIG. 3 (the pattern traversing the correction area A10) is omitted for simplification of description.

Figure 5:
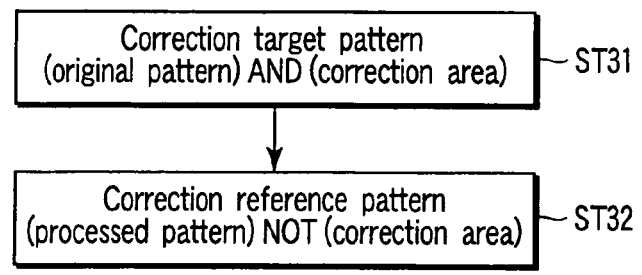
FIG. 5 is a flowchart showing a part of the pattern producing method in accordance with the embodiment of the present invention.

FIG. 5 is a flowchart showing an example of a method for producing the correction target pattern P30 and the correction reference pattern P40. The correction target pattern P30 is obtained by extracting a part of the original pattern P10 which overlaps the correction area A10. That is, the correction target pattern P30 is produced by an AND process executed on the original pattern P10 and the correction area A10 (ST31). The correction reference pattern P40 is obtained by excluding a part of the processed pattern 20 which is included in the correction area A10. That is, the correction reference pattern P40 is produced by a NOT process executed on the processed pattern P20 for the correction area A10 (ST32).

The area (correction reference pattern producing area) in which the correction reference pattern P40 is produced ranges over a given distance from an edge of the correction area A10. For example, as shown in FIG. 4, the distance between an edge of the correction reference pattern producing area A20 and the edge of the correction area A10 is set about equal to the optical radius R for photolithography.

Then, on the basis of the correction target pattern P30 and the correction reference pattern P40, the correction target pattern P30 is corrected by the correction method selected in step ST18 (St21). That is, as described above, the correction target pattern P30 is corrected taking not only the correction target pattern P30 but also the correction reference pattern P40 into account. Specifically, the correction target pattern P30 is corrected by using the OPC program selected in accordance with the type of the defect spot F10 to execute the OPC process so as to eliminate the defect spot F10.

Figure 6:
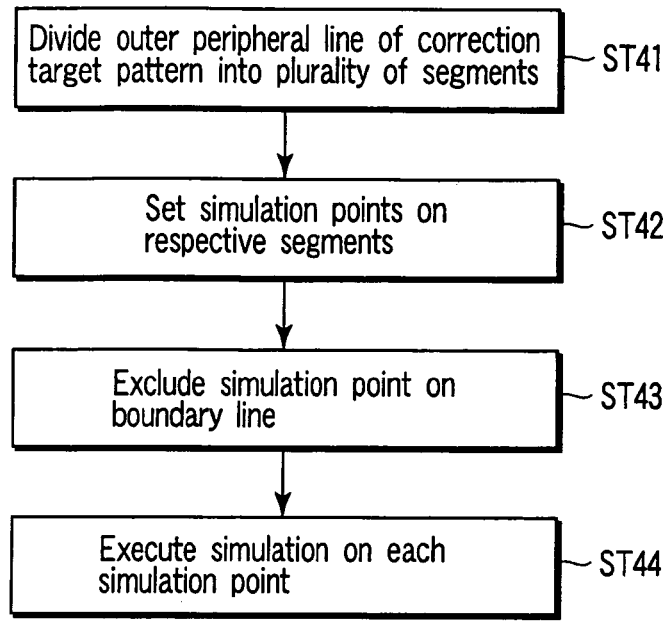
FIG. 6 is a flowchart showing a part of the pattern producing method in accordance with the embodiment of the present invention.

FIG. 6 is a flowchart showing an example of the method for correcting the correction target pattern P30.

Figure 7:
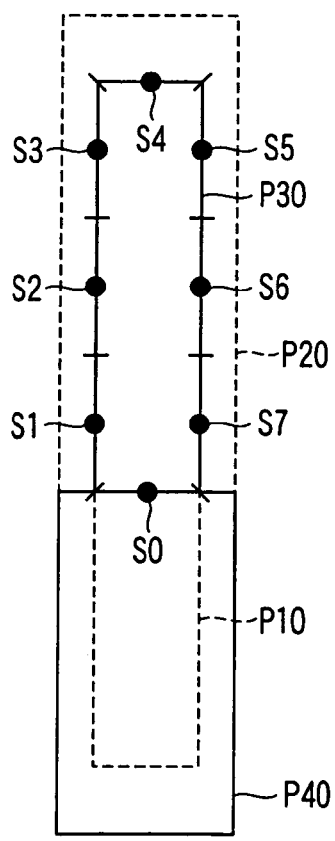
FIG. 7 is a diagram illustrating a part of the pattern producing method in accordance with the embodiment of the present invention.

First, as shown in FIG. 7, an outer peripheral line (edge) of the correction target pattern P30 is divided into a plurality of segments (ST41). Simulation points S0 to S7 are subsequently set on the respective segments (ST42). Subsequently, the simulation point S0 on the boundary line between the correction target pattern P30 and the correction reference pattern P40 is excluded from the simulation points S0 to S7 (ST43).

Figure 8:
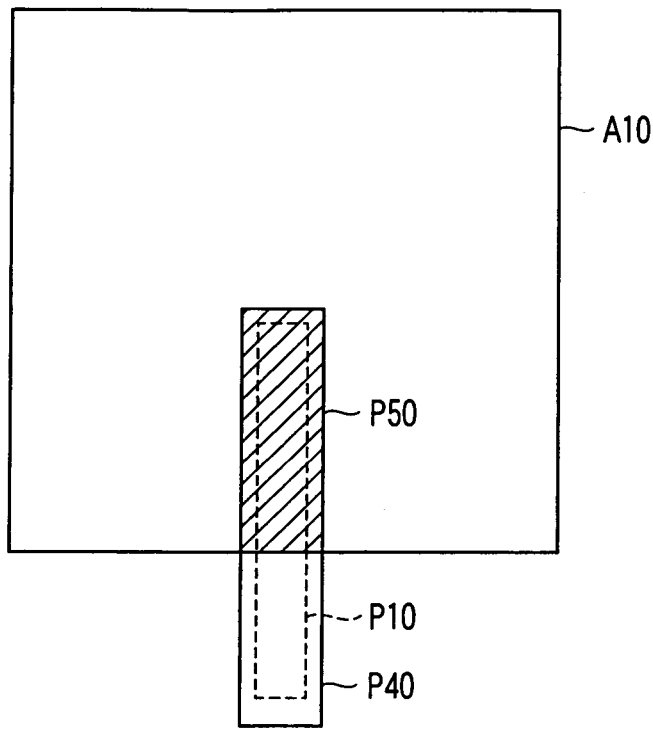
FIG. 8 is a diagram illustrating a part of the pattern producing method in accordance with the embodiment of the present invention.

Simulation is then performed on the simulation points except the one S0, that is, the simulation points S1 to S7, to correct the correction target pattern P30 (ST44). That is, the simulation is performed by the correction method selected in step ST18 taking the correction target pattern P30 and the correction reference pattern P40 into account. This allows the corrected correction target pattern P50 to be produced as shown in FIG. 8.

The reason why the simulation point S0 is excluded in step ST43 will be explained. In step ST44, each simulation point is moved by performing a simulation on each simulation point. That is, line segments on which respective simulation points are set is moved, thereby the corrected correction target pattern P50 is produced. In this case, if the simulation point S0 moves, the line segment set on the boundary line between the correction target pattern P30 and the correction reference pattern P40 moves. As a result, difficulties occur in synthesizing corrected patterns. Accordingly, the simulation point S0 is excluded in step ST43.

The method for excluding the simulation point S0 in step ST43 will be explained. In a first exclusion method, first, the AND process is executed on the correction target pattern P30 and the correction reference pattern P40 to extract the boundary line between the correction target pattern P30 and the correction reference pattern P40. The simulation point on the boundary line is excluded to exclude the simulation point S0. In a second exclusion method, first, the correction reference pattern P40 is resized to produce a resized pattern slightly larger than the correction reference pattern P40. Then, the simulation points included in the resized pattern are excluded to exclude the simulation point S0.

Then, a check is made of whether or not the pattern produced in step ST21 is appropriate (ST22). A determination is then made of whether or not a defect spot based on the corrected correction target pattern 50 is present in the correction area A10 or in an area around the periphery of the correction area A10 (ST23).

Figure 9:
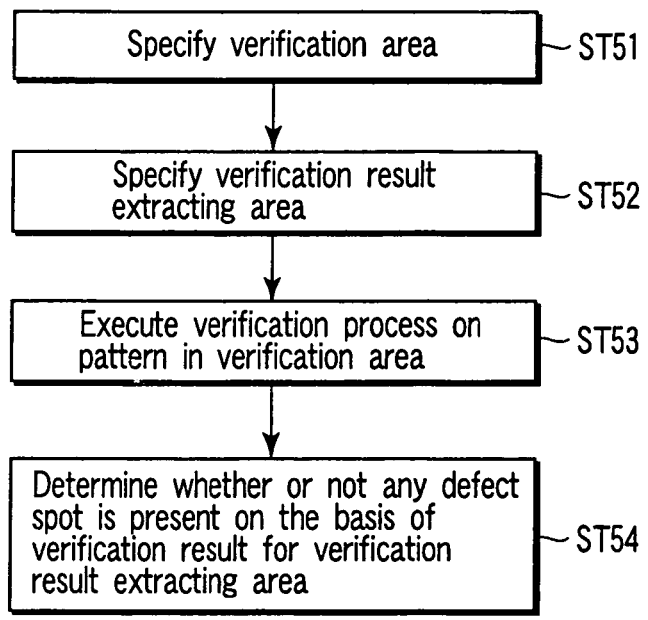
FIG. 9 is a flowchart showing a part of the pattern producing method in accordance with the embodiment of the present invention.

FIG. 9 is a flowchart showing an example of the verification method.

Figure 10:
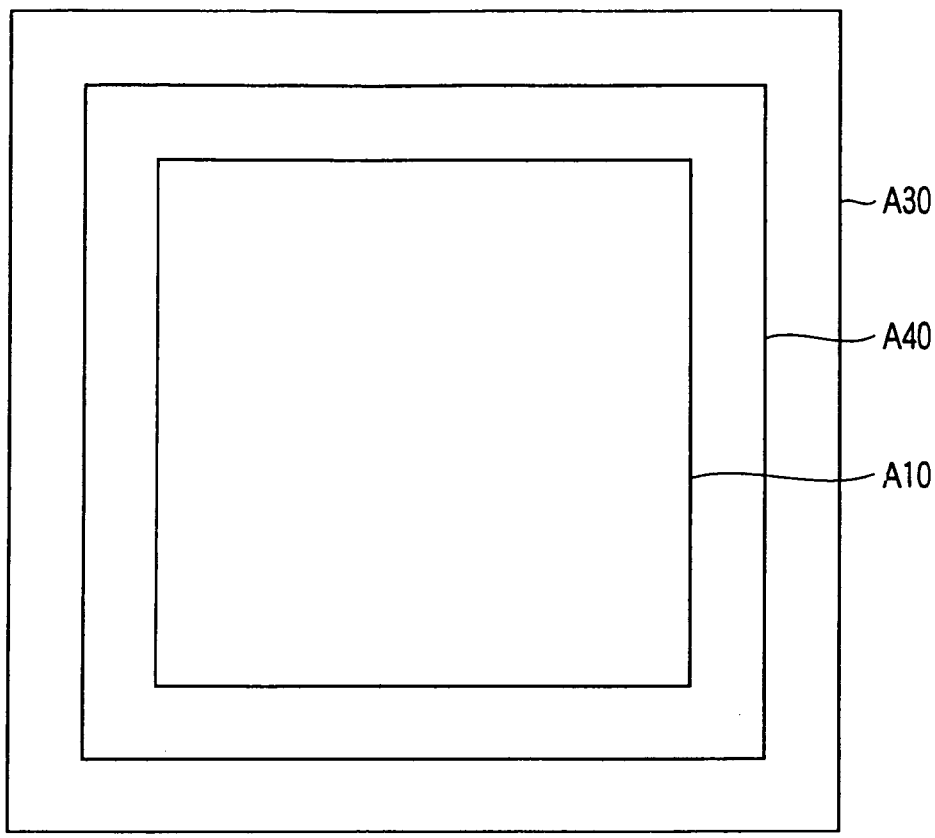
FIG. 10 is a diagram illustrating a part of the pattern producing method in accordance with the embodiment of the present invention.

First, as shown in FIG. 10, the correction area A10 is enlarged to specify a verification area A30 containing the correction area A10 (ST51). Moreover, the correction area A10 is enlarged to specify a verification result extraction area A40 containing the correction area A10 and contained in the verification area A30 (ST 52).

Then, a verification process is executed on the pattern included in the verification area A30 (ST53). Specifically, lithography rule check (LRC) is applied to the verification area A30. If any defect spot is present in the verification area A30, the defect spot is extracted. In step ST21, the correction target pattern P30 is corrected to exclude the defect spot F10. However, the correction process may result in a new defect spot. Furthermore, correcting the correction target pattern P30 may result in a defect spot around the periphery of the correction area A10. Thus, the verification process is executed on the pattern included in the verification area A30, obtained by enlarging the correction area A10.

Then, on the basis of the verification result extracted from the verification result extraction area A40, a determination is made of whether or not the verification result extracting area A40 contains any defect spot (ST54). Explanation will be given of the reason why the verification result extracting area A40, contained in the verification area A30, is used to determine whether or not any defective spot is present. In general, when the verification process is executed on the pattern in a certain area, a pseudo error is likely to occur in the vicinity of the edge of the area. Consequently, determining whether or not any defect spot is present using the verification area A30 may cause the pseudo error in the vicinity of the edge of the verification area A30, which is erroneously determined to be a defect spot. Such a problem can be prevented by using the verification result extracting area A40, contained in the verification area A30, to determine whether or not any defect spot is present.

If step ST 23 determines that a defect spot is present in the correction area A10 or in the area around the periphery of the correction area A10, steps ST17 to ST22 are executed again. In this case, for example, the correction method selected in step S18 is changed. For example, a process is executed which changes the type of the OPC program or parameters for the OPC program.

When step ST23 determines that no defect spot is present in the correction area A10 or in the area around the periphery of the correction area A10, a pattern synthesizing process is executed to produce a pattern based on the corrected correction target pattern P50 and the processed pattern P20 (ST24).

Figure 11:
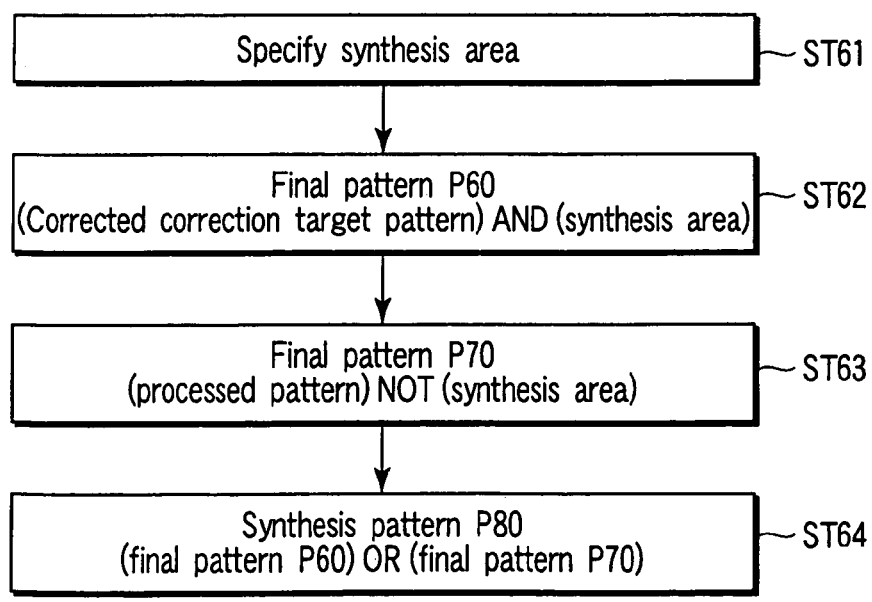
FIG. 11 is a flowchart showing a part of the pattern producing method in accordance with the embodiment of the present invention.

FIG. 11 is a flowchart showing an example of the pattern synthesizing method.

Figure 12:
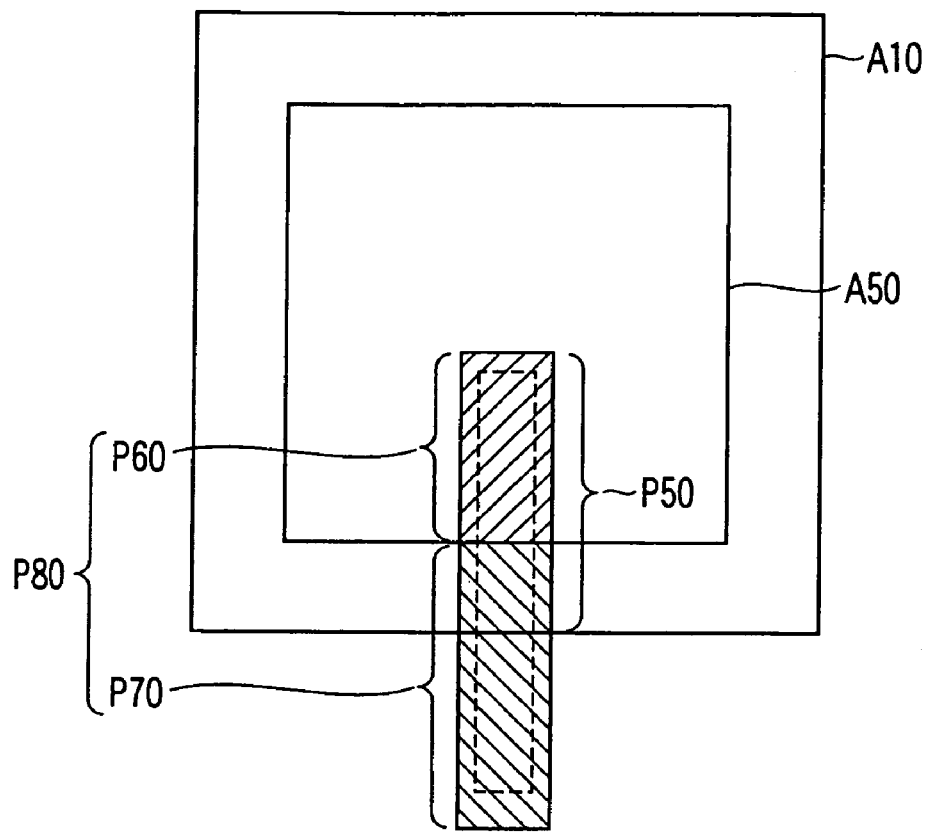
FIG. 12 is a diagram illustrating a part of the pattern producing method in accordance with the embodiment of the present invention.

First, as shown in FIG. 12, the correction area A10 is reduced to specify a synthesis area A50 contained in the correction area A10 (ST61).

Then, a part of the corrected correction target pattern P50 which overlaps the synthesis area A50 is extracted to produce a final pattern P60. That is, the AND process is executed on the corrected correction target pattern P50 and the synthesis area A50 to produce the final pattern P60 (ST62). Furthermore, a part of the processed pattern P20 which is located in the synthesis area A50 is excluded to generate a final pattern P70. That is, the NOT process is executed on the processed pattern A20 for the synthesis area A50 to produce a final pattern P70 (ST63).

The final pattern P60 and the final pattern P70 are then synthesized to produce a final synthesis pattern P80. That is, an OR process is executed on the final pattern P60 and the final pattern P70 to produce a synthesis pattern P80 (ST64).

As described above, using the synthesis area A50, contained in the correction area A10, for the pattern synthesizing process makes it possible to avoid the possible problem resulting from the edge of the corrected correction target pattern P50 (the edge on the edge of the correction area A10). This allows the final pattern P60 and the final pattern P70 to be synthesized together without disturbing the junction between the final pattern P60 and the final pattern P70.

As described above, the present embodiment does not perform pattern correction, verification, synthesis, and the like on the entire pattern but only on the correction area A10 and the area around the periphery of the correction area A10. This enables the appropriate pattern free from defect spots to be obtained without requiring much time to obtain a final pattern free from defect spots. Furthermore, appropriate corrections can be achieved by referencing the correction reference pattern to correct the correction target pattern. Further, the correction target pattern is corrected by the correction method selected in accordance with the type of the defect spot. This enables the defect spot to be effectively corrected.

The above embodiment uses a method as shown in the flowchart in FIG. 5 to generate the correction target pattern P30 and the correction reference pattern P40 in step ST19. However, such a variation as described below can also be adopted.

Figure 13:
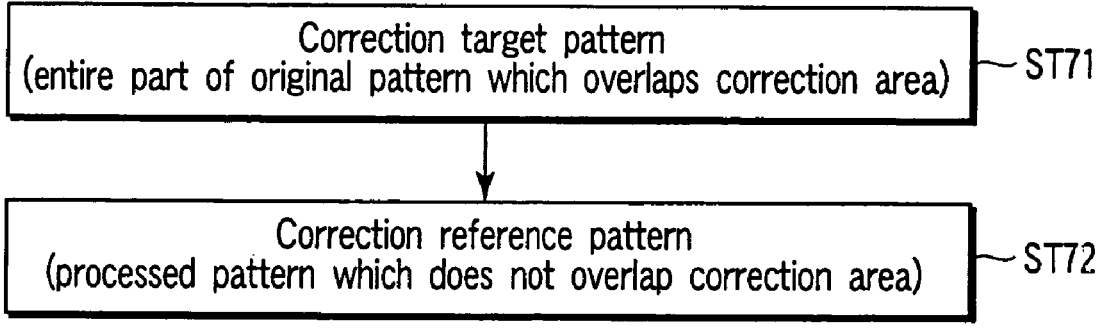
FIG. 13 is a flowchart showing a variation of the pattern producing method in accordance with the embodiment of the present invention.

FIG. 13 is a flowchart showing a variation of the method for producing the correction target pattern P30 and the correction reference pattern P40. As shown in FIG. 14, the correction target pattern P30 is obtained by extracting entire part of that one of the graphics contained in the original pattern P10 which overlap the correction area A10 (ST71). The correction reference pattern P40 is obtained by extracting that one of the graphics contained in the processed pattern P20 which do not overlap the correction area A10 (ST72).

In the method in accordance with the above variation, if any graphic included in the original pattern P10 extend across the edge of the correction area A10, a correction process is executed on the entire correction target pattern P30. This enables the width of the pattern to be made the same inside and outside the correction area A10. Consequently, the method in accordance with the above variation is effective if the pattern width is desirably fixed in terms of device properties as in the case of a gate pattern in a MIS transistor.

The above pattern producing method is applicable to a method for manufacturing a semiconductor device. FIG. 15 is a flowchart schematically showing a method for manufacturing a semiconductor device.

First, a pattern is produced using the method in accordance with the above embodiment (ST101). A photo mask is subsequently produced on the basis of the pattern generated (ST102). A mask pattern formed on the photo mask is subsequently transferred to a photo resist on the semiconductor wafer (ST103). The photo resist is subsequently developed to form a photo resist pattern (ST104). Moreover, etching is performed through the photo resist pattern as a mask to form a pattern on the semiconductor wafer (ST105).

Furthermore, the method described in the above embodiment can be implemented by a computer having operations controlled by a program describing the procedure of the method. The program can be provided via a recording medium such as a magnetic disk or a communication line (a wired line or a wireless line) such as the Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented pattern producing method comprising:

receiving, by a computer, a specification of a first pattern and a second pattern obtained by modifying the first pattern;

receiving, by a computer, a specification of a correction area including a part of the first pattern;

producing, by a computer, at least a part of the first pattern, which is included in the correction area, as a correction target pattern;

producing, by a computer, a part of the second pattern, which is not included in the correction area, as a correction reference pattern;

correcting, by a computer, the correction target pattern on the basis of the correction target pattern and the correction reference pattern; and producing, by a computer, a final pattern based on the corrected correction target pattern and the second pattern.

2. The method according to claim 1, wherein the first pattern is based on a design pattern.

3. The method according to claim 1, wherein the second pattern is obtained by applying optical proximity correction to the first pattern.

4. The method according to claim 1, wherein the correction area is specified on the basis of a defect spot attributed to the second pattern.

5. The method according to claim 4, wherein the defect spot is a spot at which defect occurrence probability in a lithography process is greater than a predetermined value.

6. The method according to claim 4, wherein the correction area is set to be a given area around the defect spot.

7. The method according to claim 4, wherein the correction target pattern is corrected by a correction method according to a type of the defect spot.

8. The method according to claim 7, wherein the correction method according to the type of the defect spot includes an optical proximity correction process according to the type of the defect spot.

9. The method according to claim 4, further comprising determining whether or not a defect spot based on the corrected correction target pattern is present in the correction area or in a periphery area of the correction area, wherein if the defect spot based on the corrected correction target pattern is determined to be not present in the correction area and in the periphery area of the correction area, the final pattern based on the corrected correction target pattern and the second pattern is produced.

10. The method according to claim 9, wherein determining whether or not the defect spot based on the corrected correction target pattern is present in the correction area or in the periphery area of the correction area comprises:

specifying a verification area containing the correction area;

specifying a verification result extracting area containing the correction area and contained in the verification area;

executing a verification process on a pattern included in the verification area; and determining whether or not the defect spot based on the corrected correction target pattern is present, on the basis of a verification result extracted from the verification result extracting area.

11. The method according to claim 1, wherein the correction target pattern is produced by extracting a part of the first pattern, which is included in the correction area.

12. The method according to claim 1, wherein the correction target pattern is produced by extracting a part of the first pattern, which traverses an edge of the correction area.

13. The method according to claim 1, wherein the correction reference pattern is taken into account when the correction target pattern is corrected.

14. The method according to claim 1, wherein correcting the correction target pattern comprises:

dividing an outer peripheral line of the correction target pattern into a plurality of segments;

setting simulation points on the respective segments;

excluding one of the simulation points, which is positioned on a boundary line between the correction target pattern and the correction reference pattern; and executing simulation on the simulation points except the excluded one to correct the correction target pattern.

15. The method according to claim 1, wherein producing the pattern based on the corrected correction target pattern and the second pattern comprises synthesizing a pattern based on the corrected correction target pattern and a pattern based on the second pattern.

16. The method according to claim 1, wherein producing the final pattern based on the corrected correction target pattern and the second pattern comprises:

receiving a specification of a synthesis area contained in the correction area;

extracting a part of the corrected correction target pattern, which is positioned in the synthesis area, to generate a first intermediate pattern;

excluding a part of the second pattern, which is positioned in the synthesis area, to generate a second intermediate pattern; and synthesizing the first and second intermediate patterns to form the final pattern.

17. A method for manufacturing a semiconductor device, the method comprising:

producing a photo mask on the basis of a pattern produced by the method according to claim 1; and transferring a pattern formed on the photo mask to a photo resist on a semiconductor wafer.

18. A computer-readable storage device configured to store program instructions for execution on a computer, the program instructions causing the computer to perform the steps of:

receiving a specification of a first pattern and a second pattern obtained by modifying the first pattern;

receiving a specification of a correction area including a part of the first pattern;

producing at least a part of the first pattern, which is included in the correction area, as a correction target pattern;

producing a part of the second pattern, which is not included in the correction area, as a correction reference pattern;

correcting the correction target pattern on the basis of the correction target pattern and the correction reference pattern; and producing a final pattern based on the corrected correction target pattern and the second pattern.

* * * * *